Figure 1:
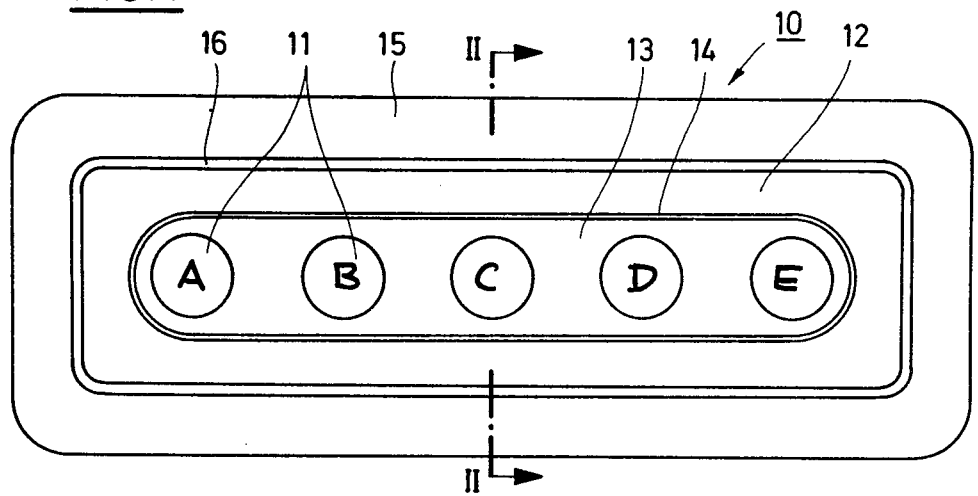

United States Patent [19]

Aichert et al.

[11] 4,237,148

[45] Dec. 2, 1980

[54] METHOD OF VAPORIZING ALLOYS OF METALS HAVING DIFFERENT VAPOR PRESSURES

[75] Inventors: Hans Aichert, Hanau am Main; Otto-Horst Hoffman, Rodenbach; Herbert Stephan, Bruchköbel, all of Fed. Rep. of Germany

[73] Assignee: Leybold-Heraeus GmbH, Köln, Fed. Rep. of Germany

[21] Appl. No.: 964,093

[22] Filed: Nov. 24, 1978

[30] Foreign Application Priority Data

Jun. 15, 1978 [DE] Fed. Rep. of Germany ....... 2826165

[51] Int. Cl.² ............................................ C23C 13/02
[52] U.S. Cl. ........................................ 427/42; 427/8; 427/43.1
[58] Field of Search ................. 427/8, 42, 43

[56] References Cited

U.S. PATENT DOCUMENTS 3,205,087  9/1965  Allen ...................................... 427/42
3,655,430  4/1972  Greaves ................................. 427/42

*Primary Examiner*—James R. Hoffman
*Attorney, Agent, or Firm*—Sprung, Felfe, Horn, Lynch & Kramer

[57] ABSTRACT

Method for vaporizing alloys containing metals having different vapor pressures from elongated vaporizing crucibles which are fed with the alloy to be vaporized in rod form at several points along the length of the crucible. The alloy is vaporized by direct bombardment of the molten bath surface with electron beams periodically deflected according to a pattern for the deposition of the alloy coating material on a plurality of substrates positioned above the vaporizing crucible. The proportional composition of the alloy to be vaporized is regulated differently over the length of the crucible such that the alloy component with the lowest boiling point (or the highest vapor pressure) is in a smaller proportion in the alloy to be vaporized which is fed to the center of the vaporizing crucible than in the alloy fed to the ends of the vaporizing crucible.

3 Claims, 3 Drawing Figures

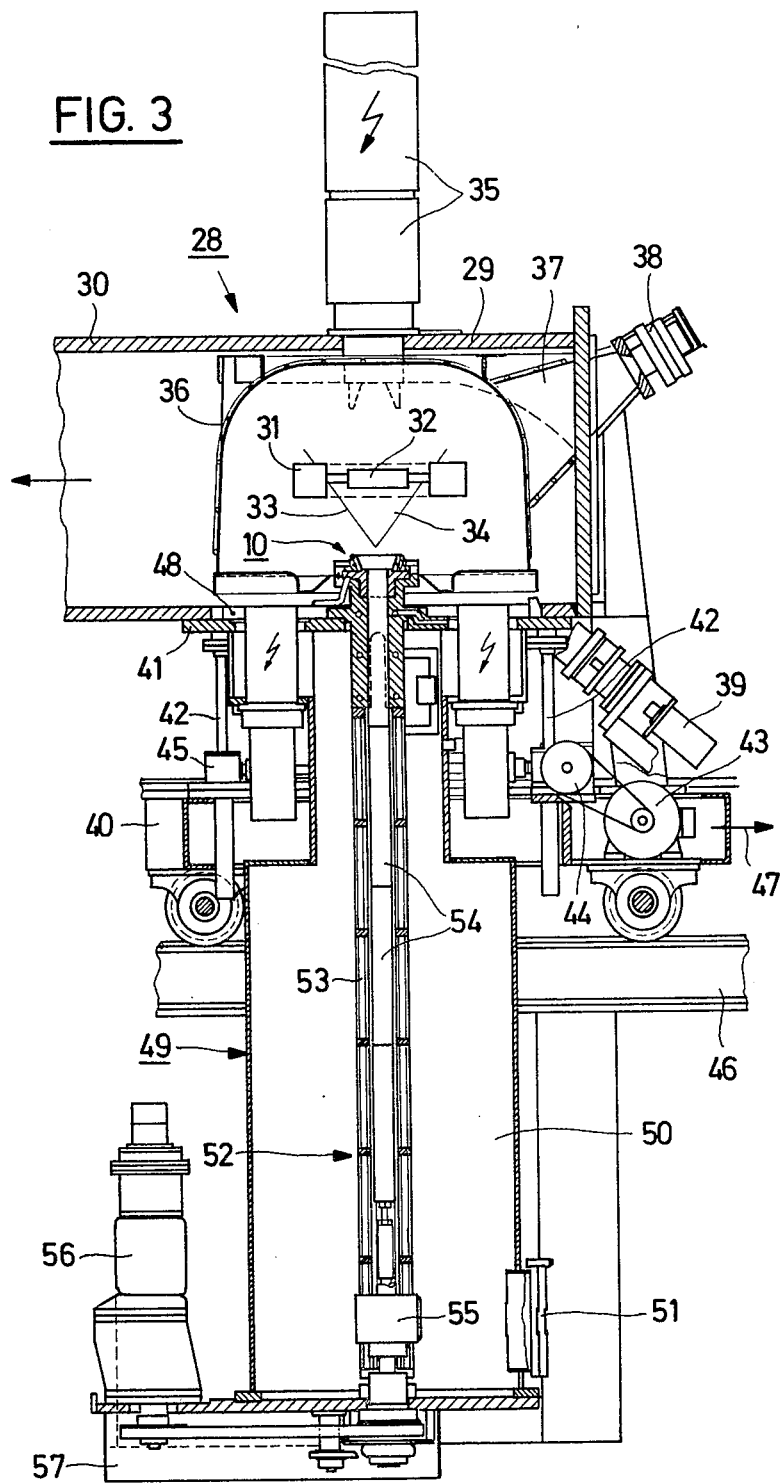

METHOD OF VAPORIZING ALLOYS OF METALS HAVING DIFFERENT VAPOR PRESSURES

BACKGROUND

This invention relates to a method of vaporizing molten alloys of metals of different vapor pressures from elongated vaporizing crucibles which are fed at several points distributed over their length with vaporizing material in rod form, by the direct bombardment of the bath surface with electron beams periodically deflected according to a pattern, and for the deposition of the alloy material onto a plurality of substrates which are arrayed in a field above the vaporizing crucible.

From a publication by Chromalloy American Corporation, New York, U.S.A., "High Temperature Resistant Coatings for Superalloy," by Seelig et al, it is known to coat gas turbine blades with oxidation- and corrosion-resistant coatings, for example of CoCrAlY and NiCoCrAlY. The coating or coatings on an individual bucket must be substantially homogeneous, i.e., they must not vary in composition from the beginning to the end of the deposition process. If the process is to be performed on a large technical scale, a plurality of blades must be coated simultaneously in a single deposition cycle. This requires large-area vaporization crucibles. The differences in thickness and composition must not depart from relatively narrow tolerances from one substrate to the next.

However, it is known that vapor deposition processes are subject to what are known as "margin effects," i.e., the thickness and composition of the coatings on the substrates situated at the margin of the vaporization crucible generally differ from those of the substrates situated in the center. To avoid a loss of coating thickness towards the margins, it is already known to increase the dwell time of an electron beam oscillating over the bath surface at both ends of the vaporizing crucible. However, the problem of different alloy compositions cannot be solved by this means alone.

From published German application No. 2,812,285, it is known to counteract the local variation of alloy compositions in the deposited coatings by bombarding the bath surface in the vaporizing crucible with one or more focused electron beams according to a particular pattern of displacement of the beam while maintaining particular dwell time ratios. The method of the invention provides a solution to the problem.

SUMMARY

In accordance with the invention, in the process described above is improved by varying the proportional composition of the alloy in the vaporizing crucible over the length thereof such that the component of the lowest boiling point or highest vapor pressure will be present in a lower proportion in the middle of the vaporizing crucible than it is at the ends of the vaporizing crucible.

In the application of the method of the invention, completely uniform coatings can be deposited simultaneously on a plurality of gas turbine blades.

DESCRIPTION

Figure 2:
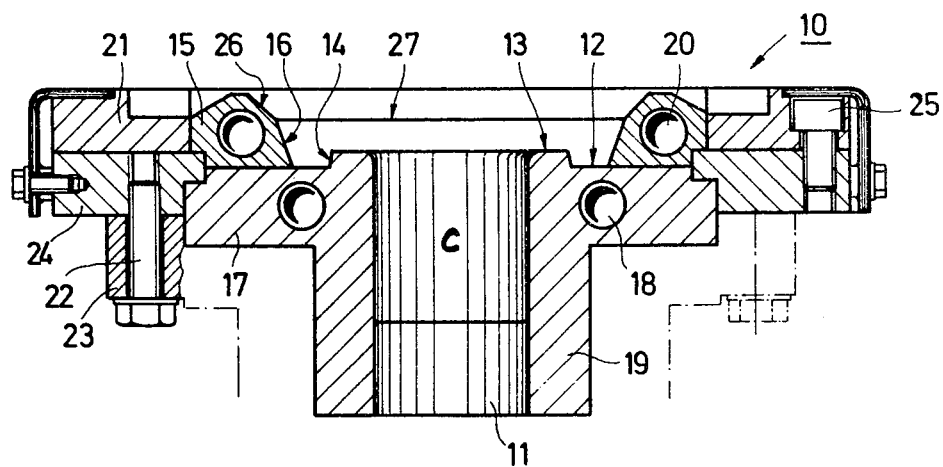

The vaporization can be produced in an elongated vaporizing crucible such as the one illustrated in FIGS. 1 and 2 of the appended drawings, whose internal dimensions determine the area of the bath surface from which the vapors are to rise, and which corresponds substantially to the area which is occupied by the substrates (turbine blades).

An embodiment of an apparatus for the practice of the method of the invention will now be described in conjunction with FIGS. 1 to 3.

FIG. 1 is a top plan view of a substantially rectangular vaporizing crucible fed by five rods situated in a row at points A, B, C, D and E, FIG. 2 is a vertical cross sectional view taken through the subject of FIG. 1 along line II—II, and FIG. 3 is a vertical cross sectional view through a complete vacuum deposition apparatus comprising the vaporizing crucible of FIGS. 1 and 2.

The vaporizing crucible 10 of FIG. 1 has a substantially rectangular plan and is provided along its longest plane of symmetry with five bottom apertures 11 which are cylindrical bores and whose axes are situated in the plane of symmetry of the vaporizing crucible. These bottom apertures constitute the points A to E at which vaporizing material in rod form is fed in from below. The bottom apertures 11 are provided in the crucible floor 12 and surrounded by a continuous rim 13 constituting a kind of plateau above the crucible floor. The rim 13 has in plan the shape of a rectangle with rounded ends; it merges with a slope 14 descending to the floor 12; this is indicated in the drawing by double lines.

The crucible floor 12 is entirely surrounded by an outer rim 15 which also has a slope 16 in its inner side facing the first rim 13. As soon as vaporizing material in rod form is fed through the bottom apertures 11 and is melted away at the top, for example by means of an electron beam, a pool of molten metal spreads within the rim 15. The surface of the melt rises above the rim 13.

Details concerning the construction of the vaporizing crucible 10 in FIG. 1 will now be further explained with the aid of FIG. 2. The crucible bottom 12 and the rim 13 are formed by the upper boundary surfaces of a bottom plate 17 which is provided with cooling passages 18. The bottom aperture 11 is surrounded by a hollow cylinder 19 which provides for the guidance and sealing off of the rods being fed through the aperture. The outer rim 15 is likewise provided with a cooling passage 20 and is welded into a flanged collar 21 which entirely surrounds the outer rim 15. Another flanged rim 24 is tightened against the bottom plate 17 by means of a plurality of bolts 22 distributed about the circumference and passed through a base plate 23. The collar 21 is tightened against collar 24 also by means of a plurality of bolts 25 distributed about the circumference.

The slope 16 forms with the crucible bottom 12 an angle of 60 to 80 degrees. At the top it merges with an additional slope 26 whose angle with respect to the crucible bottom 12 is lower, amounting, for example, to 30 to 60 degrees. The arris 27 formed between the slopes 16 and 26 simultaneously determines the fill level for the molten alloy in crucible 10 during the vaporizing process.

The use of the vaporizing crucible 10 in a vacuum depositing apparatus 28 is now to be described with the aid of FIG. 3. The apparatus consists of a vacuum chamber 29, which is connected at a laterally disposed pump connection to a vacuum pump which is not shown. Above the vaporizing crucible 10 there is a substrate holder 31 having a plurality of successively disposed substrates of which only the front one is visible in FIG. 3. The vapor stream flowing from the vaporizing crucible 10 is symbolized by the lines 33 and 34. The vaporizing crucible 10 is heated by an electron gun 35. Within the vacuum chamber 29 there is provided a radiation shield 36 which surrounds the substrates and the vaporizing crucible 10 on all sides, with the exception only of apertures which are necessary for charging and for bombardment with electron beams. An observation tube 37 with a viewing device 38 are attached laterally. A measuring instrument 39 for the supervision of the depositing process is disposed laterally below the floor of the vacuum chamber 29.

The vaporizing crucible 10 is fastened to a chassis 40 by means of a support plate 41 borne by the chassis 40 on four lifting spindles 42, of which only the two front ones are visible. By means of a motor 43, a belt drive 44 and spindle nuts 45, it is possible to lower the vaporizing crucible 10 on the support plate 41 so far down out of the vacuum chamber 29 that it can be rolled together with chassis 40 on rails 46 in the direction of the arrow 47, laterally from beneath the vacuum chamber 29. In the vacuum chamber 29 there is an aperture 48 which is hermetically sealed shut by the support plate 41 during operation.

Under the support plate 41 there is a feeding system 49 consisting of an evacuable vessel 50 containing a loading means 51 and a rod feeding means 52. The latter in turn consists of five rod guides 53 arrayed in a plane perpendicular to the plane of the drawing, at locations corresponding to the positions A to E in FIG. 1. In each rod guide 53 are stacked several rods 54 made of the alloy which is to be vaporized. They are fed into the vaporizing crucible 10 by a motor-driven feeder 55 at the rate at which they are melted therein. The feeder 55 is driven by a motor 56 and a belt drive 57.

EXAMPLES

EXAMPLE 1

In an apparatus in accordance with FIGS. 1 and 3 there was situated a vaporizing crucible having the inside or molten bath dimensions of 500 mm × 115 mm. At a distance of 37 mm apart, eleven gas turbine blades were uniformly distributed above the crucible within the dimensions of the molten bath, and were to be covered with a coating of CoCr-AlY (Co 68.5%, Cr 18%, Al 12.0%, Y 0.4%).

The vaporizing crucible was fed with vaporizing material in rod form, the alloying composition of the individual rods at positions A to E being within the following range:

| % → | A, E | B, D | C |
|---|---|---|---|
| Co | 69.5–61.5 | 70.5–62.5 | 71.5–63.5 |
| Cr | 20.0–24.0 | 19.0–23.0 | 18.0–22.0 |
| Al | 10.0–13.0 | 10.0–13.0 | 10.0–13.0 |
| Y | 0.2–0.6 | 0.2–0.6 | 0.2–0.6 |

The rod diameter in all cases was 50 mm. The electron beam heating of the vaporizing crucible was set at 150 kilowatts. Uniform coatings of the required composition were produced on the eleven turbine blades. The variations in the alloy compositions were less than ±1.0% for the critical element, chromium, in all cases.

EXAMPLE 2

The experiment described in Example 1 was repeated, except that the layers were to be produced from the alloy, NiCoCrAlY (Ni 46.5%, Co 22.0%, Cr 18.0%, Al 12.0%, Y 0.4%), instead of CoCrAlY. The rod composition at positions A to E was within the following ranges:

| % → | A, E | B, D | C |
|---|---|---|---|
| Ni | 48.5–36.0 | 49.5–37.0 | 50.5–38.0 |
| Co | 20.0–24.0 | 20.0–24.0 | 20.0–24.0 |
| Cr | 20.0–24.0 | 19.0–23.0 | 18.0–22.0 |
| Al | 11.5–14.5 | 11.5–14.5 | 11.5–14.5 |
| Y | 0.1–0.6 | 0.1–0.6 | 0.1–0.6 |

The rod diameter in all cases was 50 mm. The electron beam heating of the vaporizing crucible was set at 150 kilowatts. Uniform coatings of the required composition were produced on all of the eleven turbine blades. The differences in alloy composition with regard to the critical element, chromium, were less than 1.0% in all cases.

What is claimed is:

1. Method for vaporizing oxidation and corrosion inhibiting alloys including alloys from the group of CoCrAlY and NiCoCrAlY containing metals having different vapor pressures from elongated vaporizing crucibles which are fed with alloy to be vaporized in rod form at several points distributed over the length of the crucible by direct bombardment of the alloy bath surface with electron beams periodically deflected according to a pattern for the vapor deposition of a coating of the alloy material on a plurality of metal substrates positioned in a vacuum coating chamber above the vaporizing crucible which comprises regulating the proportional composition of the alloy to be vaporized differently over the length of the vaporizing crucible such that the alloy component with the lowest boiling point or with the highest vapor pressure is in a smaller proportion in the alloy to be vaporized which is fed to the center of the vaporizing crucible than in the alloy fed to the ends of the vaporizing crucible.

2. Method of claim 1 for the vacuum depositing of alloys from the group CoCrAlY which are fed to the vaporizing crucible at five equidistant positions A, B, C, D, E, said alloys having the following composition at the said positions:

| % → | A, E | B, D | C |
|---|---|---|---|
| Co | 69.5–61.5 | 70.5–62.5 | 71.5–63.5 |
| Cr | 20.0–24.0 | 19.0–23.0 | 18.0–22.0 |
| Al | 10.0–13.0 | 10.0–13.0 | 10.0–13.0 |
| Y | 0.2–0.6 | 0.2–0.6 | 0.2–0.6 |

3. Method of claim 1 for the vacuum deposition of alloys of the group NiCoCrAlY which are fed to the vaporizing crucible at five equidistant positions A, B, C, D, E, said alloy having the following composition at the said positions:

| % → | A, E | B, D | C |
|---|---|---|---|
| Ni | 48.5–36.0 | 49.5–37.0 | 50.5–38.0 |
| Co | 20.0–24.0 | 20.0–24.0 | 20.0–24.0 |
| Cr | 20.0–24.0 | 19.0–23.0 | 18.0–22.0 |
| Al | 11.5–14.5 | 11.5–14.5 | 11.5–14.5 |
| Y | 0.1–0.6 | 0.1–0.6 | 0.1–0.6 |

* * * * *